(12) United States Patent
Ichijo et al.

(10) Patent No.: US 7,408,234 B2
(45) Date of Patent: Aug. 5, 2008

(54) SEMICONDUCTOR DEVICE AND METHOD FOR MANUFACTURING THE SAME

(75) Inventors: Hisao Ichijo, Soraku-gun (JP);
Hiroyoshi Ogura, Kyoto (JP);
Yoshinobu Sato, Takatsuki (JP);
Teruhisa Ikuta, Ikoma (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 127 days.

(21) Appl. No.: 11/159,134

(22) Filed: Jun. 23, 2005

(65) Prior Publication Data

US 2006/0001122 A1   Jan. 5, 2006

(30) Foreign Application Priority Data

Jul. 1, 2004   (JP) ............................. 2004-195809

(51) Int. Cl.
*H01L 31/113* (2006.01)
(52) U.S. Cl. .................. 257/409; 257/333; 257/336; 257/342; 257/407; 257/408; 257/492; 257/493; 257/E29.027; 257/E29.066; 257/E29.197; 257/E29.256; 257/E29.268
(58) Field of Classification Search ................... None
See application file for complete search history.

(56) References Cited

U.S. PATENT DOCUMENTS 6,258,674 B1 *  7/2001  Kwon et al. ................ 438/286
6,380,566 B1    4/2002  Matsudai et al.
6,599,782 B1 *  7/2003  Kikuchi et al. ............. 438/147
2004/0238913 A1 * 12/2004 Kwon et al. ................ 257/492

FOREIGN PATENT DOCUMENTS

JP        2001-102586       4/2001

* cited by examiner

*Primary Examiner*—Minh-Loan Tran
*Assistant Examiner*—Leslie Pilar Cruz
(74) *Attorney, Agent, or Firm*—Wenderoth, Lind & Ponack, L.L.P.

(57) ABSTRACT

An object of the present invention is to provide a semiconductor device that is able to realize a low on-resistance maintaining a high drain-to-source breakdown voltage, and a method for manufacturing thereof, the present invention including: a supporting substrate; a semiconductor layer having a P⁻ type active region that is formed on the supporting substrate, interposing a buried oxide film between the semiconductor layer and the supporting substrate; and a gate electrode that is formed on the semiconductor layer, interposing a gate oxide film and a part of a LOCOS film between the gate electrode and the semiconductor layer, wherein the P⁻ type active region has: an N⁺ type source region; a P type body region; a P⁺ type back gate contact region; an N type drain offset region; an N⁺ type drain contact region; and an N type drain buffer region that is formed in a limited region between the N type drain offset region and the P type body region, and the N type drain buffer region is in contact with a source side end of the LOCOS film and is shallower than the N type drain offset region.

12 Claims, 11 Drawing Sheets

SEMICONDUCTOR DEVICE AND METHOD FOR MANUFACTURING THE SAME

BACKGROUND OF THE INVENTION (1) Field of the Invention

The present invention relates to a semiconductor device and a method for manufacturing thereof, and more particularly to a MOS transistor that has satisfactory high breakdown voltage characteristics and an on-resistance, and a method for manufacturing thereof.

(2) Description of the Related Art

In recent years, semiconductor devices, in which N channel MOS transistors and P channel MOS transistors are formed in SOI substrates, have been used for various applications. Particularly for semiconductor devices used in drive circuits in a plasma display which are required to achieve compatibility between improvement of breakdown voltage characteristics and reduction of an on-resistance, MOS transistors having an offset structure have been used.

The following describes a conventional MOS transistor having an offset structure with reference to the drawings.

FIG. 1 is a cross-sectional view showing a structure of an N channel MOS transistor described in Japanese Patent Laid-Open Application No. 2001-102586 publication.

The MOS transistor is composed of: a SOI substrate 100; a local-oxidation-of-silicon (LOCOS) film (hereafter referred to as LOCOS film) 105 that is formed on the SOI substrate 100 by a LOCOS method; a source electrode 115 and a drain electrode 121 that are made of metal; a gate electrode 116 that is made of polysilicon; and a gate oxide film 117 that is made of a thin silicon dioxide film. Note that a part of a surface of the SOI substrate 100 between the source electrode 115 and the drain electrode 121, on which the gate oxide film 117 is not formed, is covered with an insulating film (not shown in FIG. 1).

The SOI substrate 100 is made up of: a supporting substrate (silicon substrate) 101; a buried oxide film 102 that is formed on the supporting substrate 101; and an N⁻ type semiconductor layer 103 that is formed on the buried oxide film 102.

In the semiconductor layer 103, there are formed: a P type body region 112 that is implanted with P type impurities of a low concentration; an N type drain buffer region 118 that is implanted with N type impurities of a low concentration; an N type drain well region 122 (L in FIG. 1) that is implanted with N type impurities of a low concentration; and an N⁺ type drain contact region 120 that is implanted with N type impurities of a high concentration.

In the P type body region 112, an N⁺ type source region 111 implanted with N type impurities of a high concentration and a P⁺ type back gate contact region 114 implanted with P type impurities of a high concentration are formed to be exposed to a surface of the semiconductor layer 103, and a P type threshold value (Vt) control diffusion layer (hereafter referred to as P type Vt control diffusion layer) 113 implanted with P type impurities of a low concentration is formed to surround the N⁺ type source region 111 and the P⁺ type back gate contact region 114. Here, the P type body region 112 is electrically connected to the N⁺ type source region 111 by the source electrode 115, and the P⁺ type back gate contact region 114 improves an electric connection status in the N⁺ type source region 111 and the P type body region 112.

The N type drain buffer region 118, whose end at a source side reaches below the gate electrode 116, has a diffusion region that is overlapped on the P type body region 112. On the other hand, the N type drain well region 122 does not have such a diffusion region overlapped on the P type body region 112. Furthermore, the N type drain buffer region 118 is shallower than the P type body region 112 and the N type drain well region 122, and has a diffusion region that is in contact with the semiconductor layer 103 between the P type body region 112 and the N type drain well region 122.

The LOCOS film 105 is formed on a region on the surface of the semiconductor layer 103 between the N⁺ type source region 111 and the N⁺ type drain contact region 120, and the region is near the N⁺ type drain contact region 120. On the other hand, the gate oxide film 117 is formed on a region on the above surface, but the region is near the N⁺ type source region 111. The gate electrode 116 is formed on the gate oxide film 117 and a part of the LOCOS film 105. Here, in order to reduce electric field concentration in a neighborhood of the N⁺ type source region 111, the gate electrode 116 is formed over the LOCOS film 105 and the gate oxide film 117, which serves as a kind of field plate.

In the MOS transistor having the above structure, the diffusion region where the P type body region 112 is overlapped with the N type drain buffer region 118 has a concentration gradient such that an N type impurity concentration is varied in a transverse direction from a source side to a drain side. Therefore, when a positive high voltage is applied to the drain electrode, an electric field concentration in the transverse direction between a drain and a source is reduced, so that a high drain-to-source breakdown voltage can be realized.

Meanwhile, in the conventional MOS transistor, when a high drain-to-source breakdown voltage is to be realized, it is necessary to lower the impurity concentration in the N type drain buffer region 118 in order not to restrain an extension of a depletion layer growing from a surface of a PN junction between the P type body region 112 and the N type drain buffer region 118. However, when the impurity concentration in the N type drain buffer region 118 is lowered, resistance in the N type drain buffer region 118 is increased especially in a part ranging from the PN junction surface between the P type body region 112 and the N type drain buffer region 118 to the N type drain well region 122 (L in FIG. 1), resulting in a significant increase of an on-resistance. Therefore, the conventional MOS transistor fails to achieve compatibility between increase of the drain-to-source breakdown voltage and reduction of the on-resistance.

In order to address the above problem, as methods to reduce the on-resistance in the MOS transistor, there is a method by which a deep drain well region is formed in the drain side region adjoining the body region. FIG. 2 is a cross-sectional view showing a structure of a MOS transistor applied with the above method. Note that dashed lines in FIG. 2 show a potential distribution in the MOS transistor when the gate electrode and the source electrode are set to 0 V, and a positive high voltage is applied to the drain electrode.

The MOS transistor shown in FIG. 2 differs from the MOS transistor shown in FIG. 1 in that there is not an N type impurity region of a shallow diffusion depth between the N⁺ type source region 111 and the N⁺ type drain contact region 120 (L in FIG. 2). In the MOS transistor shown in FIG. 2, during so-called turning-on when the source electrode is set to 0 V and positive voltages are applied to the gate electrode and the drain electrode, electrons having flowed through a channel from the source pass through a deep N type drain well region 119, so that an on-resistance is significantly reduced.

However, in the MOS transistor shown in FIG. 2, since a P type impurity concentration in the P type body region 112 is relatively low, when the source electrode and the source electrode are set to 0 V and a positive voltage is applied to the drain electrode, a depletion layer significantly extends from a boundary between the P type body region 112 and the N type drain well region 119 towards a side of the P type body region 112. Furthermore, since the gate electrode is set to 0 V, potentials are skewed towards a side of the gate electrode 116. Therefore, in the N type drain well region 119 immediately under the gate oxide film 117, the potentials are distributed in a direction perpendicular to a surface of a PN junction between the P type body region 112 and the N type drain well region 119, and the potentials are concentrated in a region including the source side end of the LOCOS film 105 (A in FIG. 2), resulting in an extreme increase of an electric field. Thus, the MOS transistor shown in FIG. 2 fails to ensure a high breakdown voltage. That is, compatibility between increase of the drain-to-source breakdown voltage and reduction of the on-resistance is not able to be achieved.

Furthermore, as other methods to increase the drain-to-source breakdown voltage in the MOS transistor, there is a method by which a distance in the transverse direction between the $N^+$ type source region and the $N^+$ type drain contact region is lengthened. However, this results in just enlargement of device dimensions, which causes a new problem of enlargement of chip dimensions.

SUMMARY OF THE INVENTION

In view of the above problems, it is an object of the present invention to provide a semiconductor device that increases a drain-to-source breakdown voltage while simultaneously maintaining a low on-resistance, and a method for manufacturing thereof.

According to a first aspect of the present invention, in order to achieve the above object, there is provided a semiconductor device that is a MOS transistor, the semiconductor device including: a semiconductor substrate; a semiconductor layer of a first conductivity type that is formed above the semiconductor substrate; and a gate electrode that is formed above the semiconductor layer in a structure where a gate insulating film is placed between the gate electrode and the semiconductor layer. The semiconductor layer has: a body region of the first conductivity type; a source region of a second conductivity type that is formed in the body region to be exposed to a surface of the semiconductor layer; a drain offset region of the second conductivity type; a drain contact region of the second conductivity type that is formed in the drain offset region to be exposed to the surface of the semiconductor layer; and a drain buffer region of the second conductivity type that is formed between the drain offset region and the body region to be positioned adjoining the drain offset region and the body region. The gate insulating film is made up of: a thin film part that is positioned at a side of the source region; and a thick film part that is positioned at a side of the drain contact region and that has an end connected to the thin film part, and the drain buffer region is in contact with the end of the thick film part and has a depth that is less than a depth of the drain offset region. In the forgoing first aspect, a preferable mode is one wherein the depth of the drain buffer region may be one-third to one-half of a depth of a drain offset region. Another preferable mode is one that may further include an element isolation region, wherein the semiconductor layer may be formed above the semiconductor substrate in a structure where a buried insulating film is placed between the semiconductor layer and the semiconductor substrate. Still another preferable mode is one wherein the thick film part of the gate insulating film may be formed by a local-oxidation-of-silicon method.

With the above structure, the semiconductor device according to the present invention has a structure that has a region in contact with an end of the thick film part of the gate insulating film (in other words, a region where electric field is increased), and that forms the drain buffer region shallower than the drain offset region between the body region and the drain offset region, to thereby reduce an electric field in the region where a potential concentration is increased. Thus, it is possible to realize a semiconductor device that increases a drain-to-source breakdown voltage. Further, the drain offset region is able to be deepened, thus making it possible to realize a semiconductor device that reduces an on-resistance. That is, it is possible to realize a semiconductor device that increases the drain-to-source breakdown voltage while simultaneously maintaining the low on-resistance. Furthermore, the drain buffer region, where an impurity concentration is lowered to hereby improve breakdown voltage characteristics, is able to be limited within a local region, thus making it possible to realize a semiconductor device that minimizes an increase of the on-resistance accompanied with further improvement of the breakdown voltage characteristics. Still further, by varying the impurity concentration in the drain buffer region, the drain-to-source breakdown voltage and the on-resistance can be freely varied, thus making it possible to realize a semiconductor device that has high design flexibility.

In the forgoing first aspect, a further preferable mode is one wherein the semiconductor layer may further have an impurity region of the first conductivity type that is formed immediately under the drain buffer region.

With the above structure, a depletion layer extending from a PN junction part between the body region and the drain offset region is difficult to extend to a body region side, to thereby reduce an electric field in the region where potential concentration is increased, thus making it possible to realize a semiconductor device that significantly increases the drain-to-source breakdown voltage. Further, by effect of increase of the drain-to-source breakdown voltage, the impurity concentration in the drain buffer region is increased to thereby reduce the on-resistance.

In the forgoing first aspect, a still further preferable mode is one wherein the impurity region may have a region that is overlapped with the body region.

With the above structure, the depletion layer extending from the PN junction part between the body region and the drain offset region is difficult to extend to the body region side, to thereby further reduce a potential concentration in the region where the electric field is increased. Thus, it is possible to realize a semiconductor device that further increases the drain-to-source breakdown voltage.

In the forgoing first aspect, a still further preferable mode is one wherein an impurity concentration of the drain buffer region may be lower than an impurity concentration of the drain offset region.

With the above structure, the impurity concentration in the region where the electric field is increased is able to be reduced, thus making it possible to realize a semiconductor device that further increases the drain-to-source breakdown voltage.

According to a second aspect of the present invention, there is provided a method for manufacturing a semiconductor device, the method including: forming a body region of a first conductivity type in a semiconductor layer of the first conductivity type, by implanting an impurity of the first conductivity type into the semiconductor layer; forming a source region of a second conductivity type in the body region to be exposed to a surface of the semiconductor layer, by implanting an impurity of the second conductivity type into the semiconductor layer; forming a drain offset region of the second conductivity type in the semiconductor layer, by implanting an impurity of the second conductivity type into the semiconductor layer; forming a drain contact region of the second conductivity type in the drain offset region to be exposed to the surface of the semiconductor layer, by implanting an impurity of the second conductivity type into the semiconductor layer; forming a drain buffer region of the second conductivity type between the body region and the drain offset region in the semiconductor layer to be in contact with the body region and the drain offset region, by implanting an impurity of the second conductivity type into the semiconductor layer, with the drain buffer region having a depth that is less than a depth of the drain offset region; forming a first gate insulating film above the body region and the drain buffer region in the semiconductor layer; and forming a second gate insulating film thicker than the first gate insulating film on the semiconductor layer to have an end connected to the first gate insulating film and to have the end in contact with the drain buffer region. In the forgoing second aspect, a preferable mode is one wherein forming of the second gate insulating film may include forming the second gate insulating film by a local-oxidation-of-silicon method. Another mode is one wherein forming of the drain buffer region may include forming the drain buffer region to have a depth that is one-third to one-half of a depth of the drain offset region. Still another mode is one that may further include: forming a buried insulating film on the semiconductor substrate to form semiconductor layer in a structure where the buried insulating film is placed between the semiconductor substrate and the semiconductor layer; and forming an element isolation region in the semiconductor layer.

By the above method, it is possible to realize a method for manufacturing a semiconductor device that increases the drain-to-source breakdown voltage while simultaneously maintaining the low on-resistance. Further, it is possible to realize a method for manufacturing a semiconductor device that minimizes increase of the on-resistance accompanied with further increase of high breakdown voltage characteristics. Furthermore, it is possible to realize a method for manufacturing a semiconductor device that has high design flexibility.

In the forgoing second aspect, a preferable mode is one that may further include forming an impurity region of the first conductivity type immediately under the drain buffer region in the semiconductor layer, by implanting an impurity of the first conductivity type into the semiconductor layer.

By the above method, it is possible to realize a method for manufacturing a semiconductor device that significantly increases the drain-to-source breakdown voltage. Further, it is possible to realize a method for manufacturing a semiconductor device that further reduces the on-resistance.

Another preferable mode is one wherein forming of the impurity region may include forming the impurity region to have a region that is overlapped with the body region.

By the above method, it is possible to realize a method for manufacturing a semiconductor device that further increases the drain-to-source breakdown voltage.

Still another preferable mode is one wherein forming of the drain buffer region may include forming the drain buffer region to have an impurity concentration that is lower than an impurity concentration of the drain offset region.

By the above method, it is possible to realize a method for manufacturing a semiconductor device that further increases the drain-to-source breakdown voltage.

As obvious from the above description, the semiconductor device and the method for manufacturing thereof according to the present invention can increase the drain-to-source breakdown voltage while maintaining the low on-resistance. Further, the semiconductor device and the method for manufacturing thereof can significantly increase the drain-to-source breakdown voltage. Furthermore, the semiconductor device and the method for manufacturing thereof can increase design flexibility.

Accordingly, the present invention can provide a MOS transistor that increases a drain-to-source breakdown voltage while simultaneously maintaining a low on-resistance, and a method for manufacturing thereof, which results in a significantly high practical value of the present invention.

Further Information about Technical Background to this Application

The disclosure of Japanese Patent Application No. 2004-195809 filed on Jul. 1, 2004 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate specific embodiments of the invention. In the Drawings.

DETAILED DESCRIPTION OF THE PREFERRED EMBODIMENT(S)

The following describes a semiconductor device and a method for manufacture thereof according to embodiments of the present invention with reference to the drawings.

First Embodiment

Figure 3:
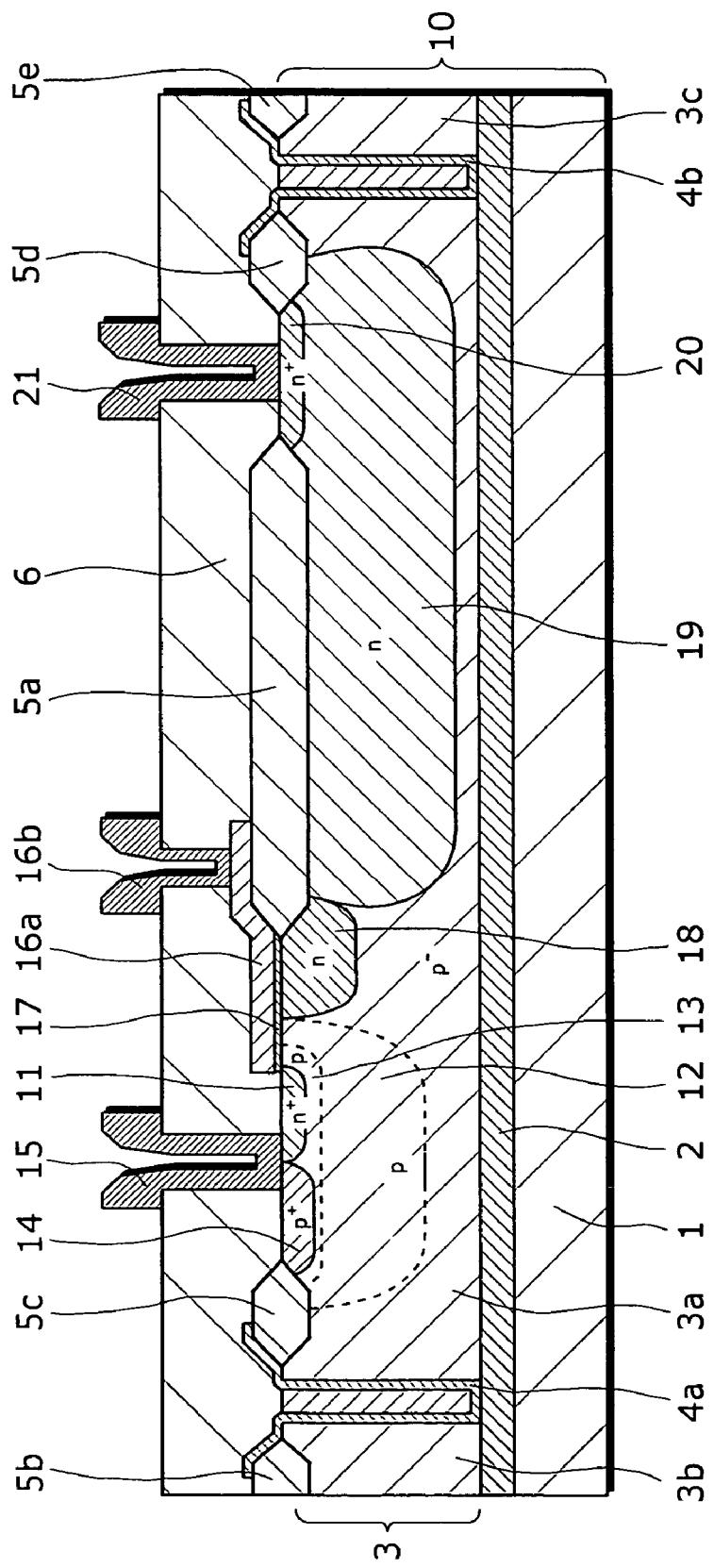
FIG. 3 is a cross-sectional view showing a structure of a MOS transistor according to a first embodiment of the present invention.

FIG. 3 is a cross-sectional view showing a structure of an N channel MOS transistor according to a first embodiment of the present invention.

As shown in FIG. 3, the MOS transistor according to the first embodiment has an offset structure, and is composed of: an SOI substrate 10; LOCOS films 5a to 5e each having a respective thickness of more than 300 nm, for example, about 420 nm, and which are formed on the SOI substrate 10 by an LOCOS method; a source electrode 15, a drain electrode 21, and a gate lead-out electrode 16b that are made of metal; a gate electrode 16a that is made of polysilicon; a gate oxide film 17 that is made of a silicon dioxide film having a thickness of about 10 nm to 20 nm and which is formed by a thermal oxidation process; and an interlayer insulating film 6 that covers the SOI substrate 10.

The SOI substrate 10 is made up of: a supporting substrate (silicon substrate) 1; a buried oxide film 2 having a thickness of about 1 μm to 3 μm that is formed on the supporting substrate 1; and a P$^-$ type semiconductor layer 3 having a thickness of about 3 μm to 5 μm that is formed on the buried oxide film 2. Here, the SOI substrate 10 is formed by joining two silicon substrates implanted with impurities of a low concentration, arranging the buried oxide film 2 therebetween, and by polishing one of the silicon substrates to make it thin.

The semiconductor layer 3 has a plurality of P$^-$ type active regions 3a to 3c that are separated by trench isolation regions (element isolation regions) 4a and 4b. In the P$^-$ type active region 3a, there are formed: a P type body region 12 that is implanted with P type impurities of a low concentration; an N type drain offset region 19 that is implanted with N type impurities of a low concentration; and an N type drain buffer region 18 that is implanted with N type impurities whose concentration is lower than that in the N type drain offset region 19. Note that impurity concentration in the N type drain buffer region 18 may be higher than that in the N type drain offset region 19.

In the P type body region 12, there are formed: an N$^+$ type source region 11 implanted with N type impurities of a high concentration and a P$^+$ type back gate contact region 14 implanted with P type impurities of a high concentration which are exposed at a surface of the semiconductor layer 3; and a P type Vt control diffusion layer 13 implanted with P type impurities of a low concentration which surrounds the N$^+$ type source region 11 and the P$^+$ type back gate contact region 14. Here, the P type body region 12 is electrically connected to the N$^+$ type source region 11 by the source electrode 15, and the P$^+$ type back gate contact region 14 improves electric connection status in the N$^+$ type source region 11 and the P type body region 12. Note that the P type Vt control diffusion layer 13 is formed in order to set a threshold voltage Vt of the MOS transistor to a most suitable value, but it does not necessarily have to be formed.

The N type drain buffer region 18 is formed in a region between the P type body region 12 and the N type drain offset region 19 so that both ends of the N type drain buffer region 18 come into contact with one of the P type body region 12 and the N type drain offset region 19. Here, the N type drain buffer region 18 is formed in a local region immediately under a source side end (tapered section) of the LOCOS film 5a, in order to come into contact with and cover the tapered section of the source side end of the LOCOS film 5a.

The N type drain offset region 19 has a depth that is deeper, for example, twice to three times deeper than that of the N type drain buffer region 18, and is formed in a region adjoining the drain side of the N type drain buffer region 18. Furthermore, in the N type drain offset region 19, an N$^+$ type drain contact region 20 implanted with N type impurities of a high concentration is formed to be exposed to a surface of the semiconductor layer 3. Here, the N$^+$ type drain contact region 20 is placed opposite the N$^+$ type source region 11 across the LOCOS film 5a, the gate electrode 16a, and the gate oxide film 17.

The LOCOS film 5a is formed in a region on the surface of the semiconductor layer 3, and the region is between the N$^+$ type source region 11 and the N$^+$ type drain contact region 20 and near the N$^+$ type drain contact region 20, so that the source side end of the LOCOS film 5a comes into contact with the gate oxide film 17. On the other hand, the gate oxide film 17 is formed in a region on the above surface, but the region is near the N$^+$ type source region 11. The gate electrode 16a is formed on the gate oxide 17 and on a part of the LOCOS film 5a. The gate electrode 16a has a part formed astride the LOCOS film 5a which serves as a kind of field plate, reducing electric field concentration in a neighborhood of the N$^+$ type source region 11. Furthermore, a gate insulating film is formed including the gate oxide film 17 and an end of the LOCOS film 5a connected to the gate oxide film 17.

The trench isolation regions 4a and 4b are made up of: an oxide film that is formed to cover a trench surface; and polysilicon that is formed on the oxide film in a trench in order to fill the trench.

Note that in the P$^-$ type active region 3a, a drain well region having an impurity concentration that is higher than that in the N type drain offset region 19 and lower than that in the N⁺ type drain contact region 20 may be formed to surround the N⁺ type drain contact region 20.

Next, the following describes a method for manufacturing the MOS transistor having the above structure.

FIGS. 4A to 4D, 5A to 5D, and 6A and 6B are cross-sectional sequential views showing processes in the method for manufacturing the MOS transistor.

Figure 4A:
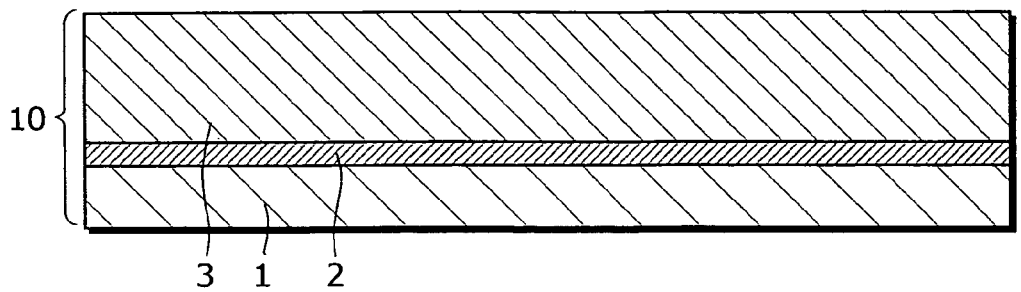
FIG. 4A is a cross-sectional view showing a manufacturing process for the MOS transistor according to the first embodiment of the present invention.

First, as shown in FIG. 4A, the SOI substrate 10 that has the buried oxide film 2 formed on the supporting substrate 1, and the semiconductor layer 3 formed on the buried oxide film 2 is prepared.

Figure 4B:
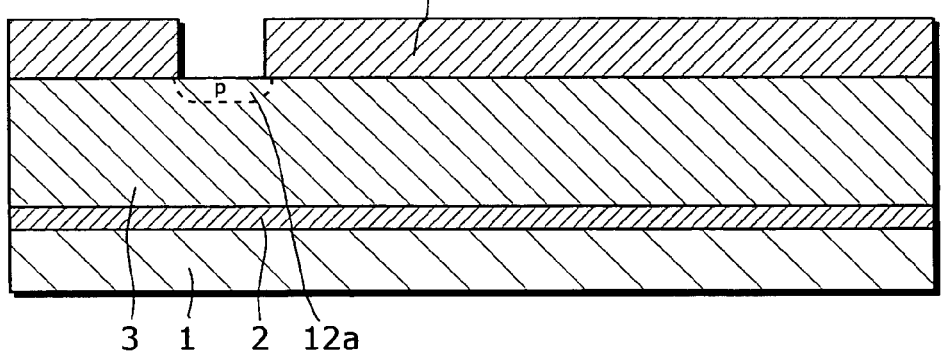
FIG. 4B is a cross-sectional view showing a manufacturing process for the MOS transistor according to the first embodiment of the present invention.

Next, as shown in FIG. 4B, after forming a resist film 7 having a thickness of about 1 μm to 3 μm on the semiconductor layer 3, a resist pattern for forming the P type body region 12 is formed. Then, using the resist film 7 as a mask, with an accelerating voltage of 50 keV to 200 keV and a dose amount of $5\times10^{11}$ cm$^{-2}$ to $1\times10^{13}$ cm$^{-2}$, boron ions (B⁺) as P type impurities are implanted into the semiconductor layer 3. Here, the implanted boron ions are positioned near the surface of the semiconductor layer 3 as an impurity-implanted region 12a, and are not activated as a diffusion layer. After the boron ion implantation has been completed, the resist film 7 used as the mask is removed by an etching process.

Figure 4C:
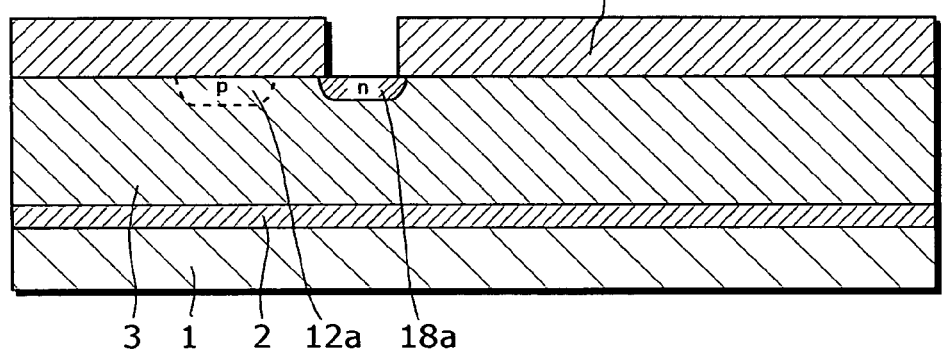
FIG. 4C is a cross-sectional view showing a manufacturing process for the MOS transistor according to the first embodiment of the present invention.

Next, as shown in FIG. 4C, after forming a resist film 8 having a thickness of about 1 μm to 3 μm on the semiconductor layer 3, a resist pattern for forming the N type drain buffer region 18 is formed. Then, using the resist film 8 as a mask, with an accelerating voltage of 50 keV to 500 keV and a dose amount of $5\times10^{11}$ cm$^{-2}$ to $1\times10^{13}$ cm$^{-2}$, phosphorus ions as N type impurities are implanted into the semiconductor layer 3. Here, the implanted phosphorus ions are positioned near the surface of the semiconductor layer 3 as an impurity-implanted region 18a, and are not activated as a diffusion layer. After the phosphorus ion implantation has been completed, the resist film 8 used as the mask is removed by an etching process.

Figure 4D:
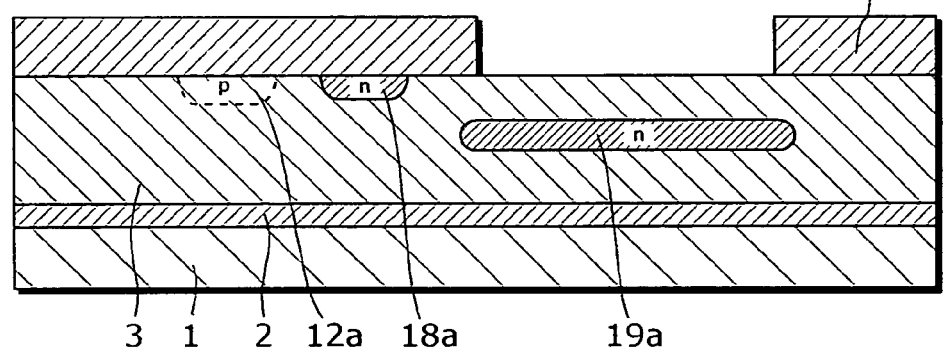
FIG. 4D is a cross-sectional view showing a manufacturing process for the MOS transistor according to the first embodiment of the present invention.

Next, as shown in FIG. 4D, after forming resist film 9 having a thickness of about 2 μm to 4 μm on the semiconductor layer 3, a resist pattern for forming the N type drain offset region 19 is formed. Then, using the resist film 9 as a mask, with a high accelerating voltage of 500 keV to 2.5 MeV and a dose amount of $5\times10^{11}$ cm$^{-2}$ to $1\times10^{13}$ cm$^{-2}$, phosphorus ions as N type impurities are implanted into the semiconductor layer 3. Here, the implanted phosphorus ions are positioned at a predetermined depth from the surface of the semiconductor layer 3 as an impurity-implanted region 19a, and are not activated as a diffusion layer. After the phosphorus ion implantation has been completed, the resist film 9 used as the mask is removed by an etching process.

Figure 5A:
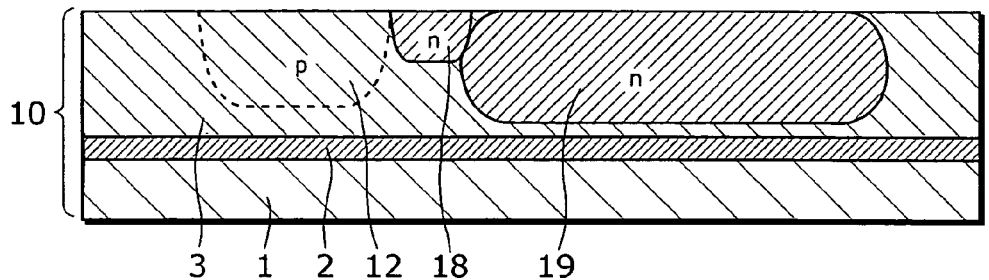
FIG. 5A is a cross-sectional view showing a manufacturing process for the MOS transistor according to the first embodiment of the present invention.

Next, as shown in FIG. 5A, a thermal process is applied to the SOI substrate 10 with a high temperature of 1100° C. to 1200° C. for 120 to 180 minutes, in order to diffuse the impurity-implanted regions 12a, 18a, and 19a to a predetermined diffusion depth, so that inactivated impurities become activated. With the above process, the P type body region 12, the N type drain buffer region 18, and the N type drain offset region 19 are formed.

Here, by adjusting conditions of the ion implantation and a thermal process for forming the N type drain offset region 19, an impurity concentration peak in the N type drain offset region 19 is set to about $6\times10^{15}$ cm$^{-3}$ and a diffusion depth is set to more than 3 μm. Furthermore, by adjusting conditions of the ion implantation and a thermal process when forming the N type drain buffer region 18, an impurity concentration peak near a surface of the N type drain buffer region 18 is set to about $1\times10^{16}$ cm$^{-3}$ and a diffusion depth is set to about 1.5 μm to 2.0 μm.

Figure 5B:
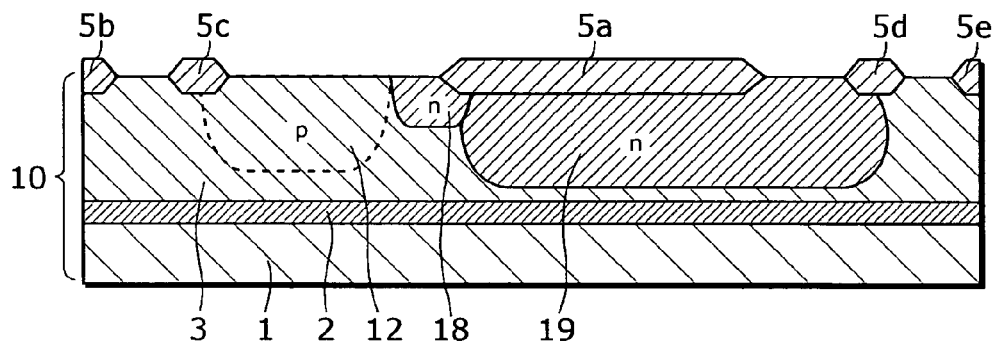
FIG. 5B is a cross-sectional view showing a manufacturing process for the MOS transistor according to the first embodiment of the present invention.

Next, as shown in FIG. 5B, a nitride film (not shown in this figure) is formed on the semiconductor layer 3, having opened regions on the surface of the semiconductor film 3 to have formed therein the LOCOS films 5a to 5e. Then, a thermal process is applied to the SOI substrate 10 by introducing steam, in order to form the LOCOS films 5a to 5e in the opened regions of the nitride film (not shown), and then the nitride film (not shown) is removed.

Figure 5C:
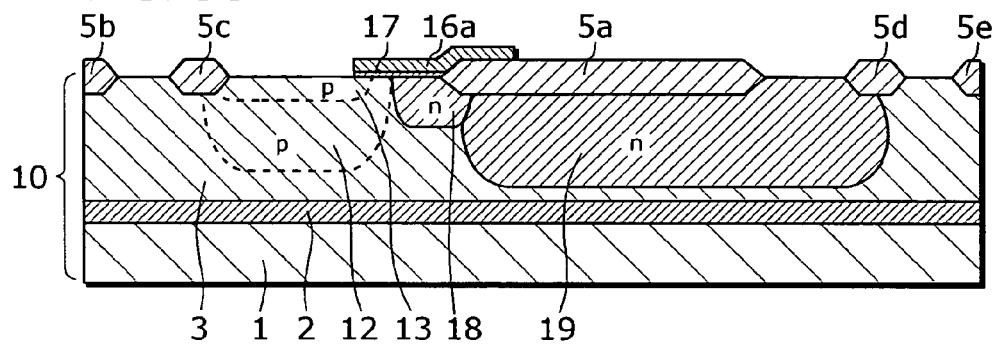
FIG. 5C is a cross-sectional view showing a manufacturing process for the MOS transistor according to the first embodiment of the present invention.

Next, as shown in FIG. 5C, after forming a gate oxide film having a thickness of about 10 nm to 20 nm on the semiconductor layer 3, a polysilicon film is formed on the gate oxide film 17 and the LOCOS films 5a to 5e. Then, by patterning the gate oxide film and the polysilicon film, the gate electrode 16a is formed. After forming a resist film (not shown), whose predetermined part is opened, on the semiconductor layer 3, the LOCOS films 5a to 5c, and the gate electrode 16a, using the resist film (not shown) as a mask, with an accelerating voltage of 50 keV to 200 keV and a dose amount of $5\times10^{12}$ cm$^{-2}$ to $5\times10^{14}$ cm$^{-2}$, boron ions as P type impurities are implanted into the semiconductor layer 3 by ion implantation, in order to form the P type Vt control diffusion layer 13. After the boron ion implantation has been completed, the resist film (not shown) used as the mask is removed by an etching process.

Figure 5D:
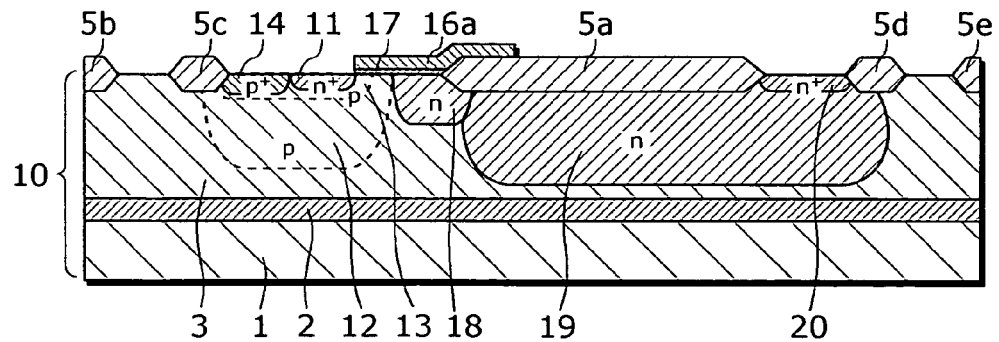
FIG. 5D is a cross-sectional view showing a manufacturing process for the MOS transistor according to the first embodiment of the present invention.

Next, as shown in FIG. 5D, after forming a resist film (not shown) on the semiconductor layer 3, a resist pattern for forming the N⁺ type source region 11 and the N⁺ type drain contact region 20 is formed. Then, using the resist film (not shown) as a mask, with an accelerating voltage of 30 keV to 100 keV and a dose amount of $1\times10^{15}$ cm$^{-2}$ to $1\times10^{16}$ cm$^2$, arsenic as N type impurities is implanted into the semiconductor layer 3 by ion implantation, in order to form the N⁺ type source region 11 and the N⁺ type drain contact region 20 at the same time. Then, in the same manner as described above, using as a mask a resist film on which a resist pattern for forming the P⁺ type back gate contact region 14 is formed, with an accelerating voltage of 10 keV to 70 keV and a dose amount of $1\times10^{15}$ cm$^{-2}$ to $1\times10^{16}$ cm$^{-2}$, BF² is implanted into the semiconductor layer 3 by ion implantation, in order to form the P⁺ type back gate contact region 14.

Figure 6A:
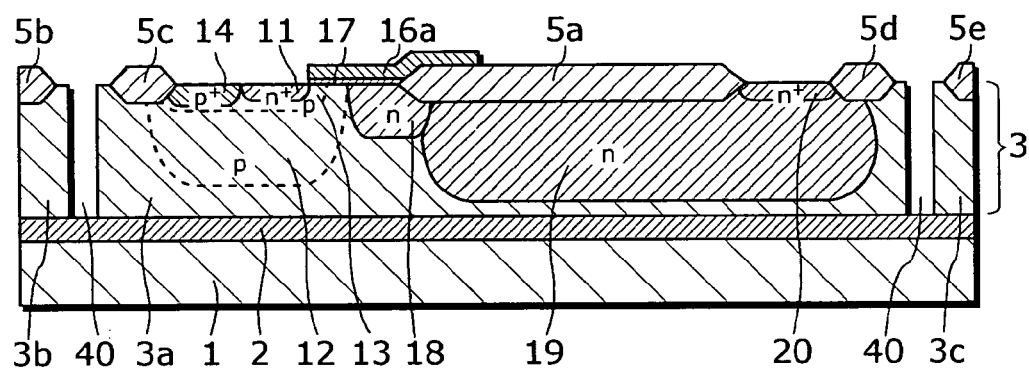
FIG. 6A is a cross-sectional view showing a manufacturing process for the MOS transistor according to the first embodiment of the present invention.

Next, as shown in FIG. 6A, after forming a resist film (not shown) on the semiconductor layer 3, a resist pattern for forming trenches 40 is formed. Then, by etching the semiconductor layer 3 using a mask of the resist film (not shown), the trenches 40 that penetrate through the semiconductor layer 3 to reach the buried oxide film 2 are formed.

Figure 6B:
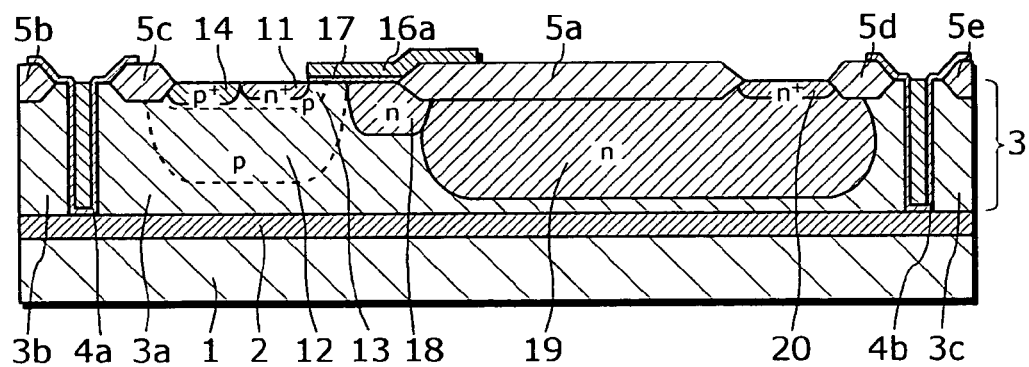
FIG. 6B is a cross-sectional view showing a manufacturing process for the MOS transistor according to the first embodiment of the present invention.

Next, as shown in FIG. 6B, an oxide film is formed on the semiconductor layer 3 having the trenches 40, and then polysilicon is deposited on the oxide film, in order to form the trench isolation regions 4a and 4b.

Subsequent processes after the above are not illustrated, but after forming an interlayer insulation film 6 on the semiconductor layer 3, and contact holes in the interlayer insulation film 6, by depositing a metal film made of copper, aluminum, or the like by a vapor deposition process, and sequentially by patterning the metal film, there are formed the source electrode 15, the gate lead-out electrode 16b and the drain electrode 21.

Through the processes described above, the MOS transistor having the structure shown in FIG. 3 is obtained.

Next, the following describes operations of the MOS transistor according to the first embodiment.

Figure 7:
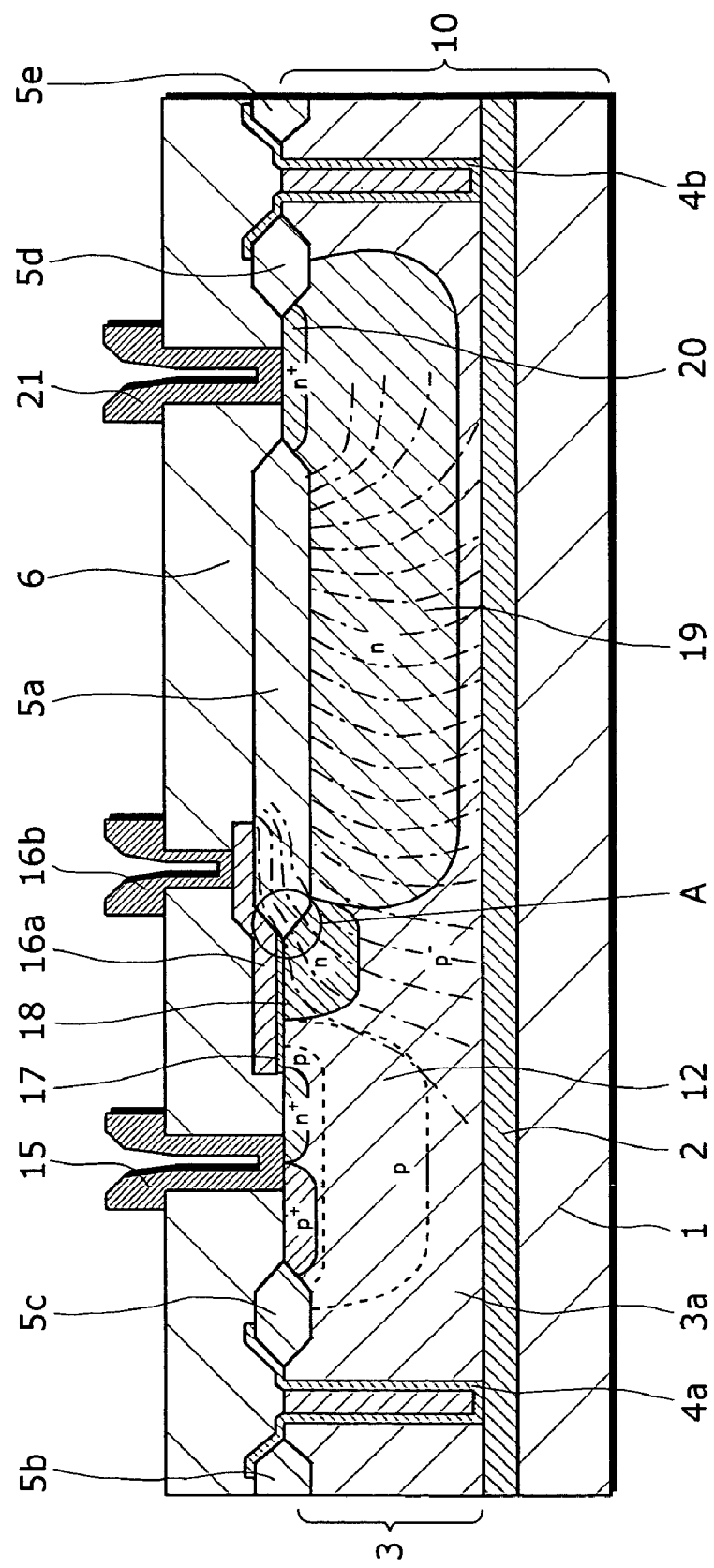
FIG. 7 is a cross-sectional view showing a potential distribution in the MOS transistor according to the first embodiment of the present invention.

FIG. 7 is a cross-sectional view showing the MOS transistor. Note that dashed lines in FIG. 7 show a potential distribution in the MOS transistor when the gate electrode and the source electrode are set to 0 V and a positive high voltage is applied to the drain electrode.

Figure 1:
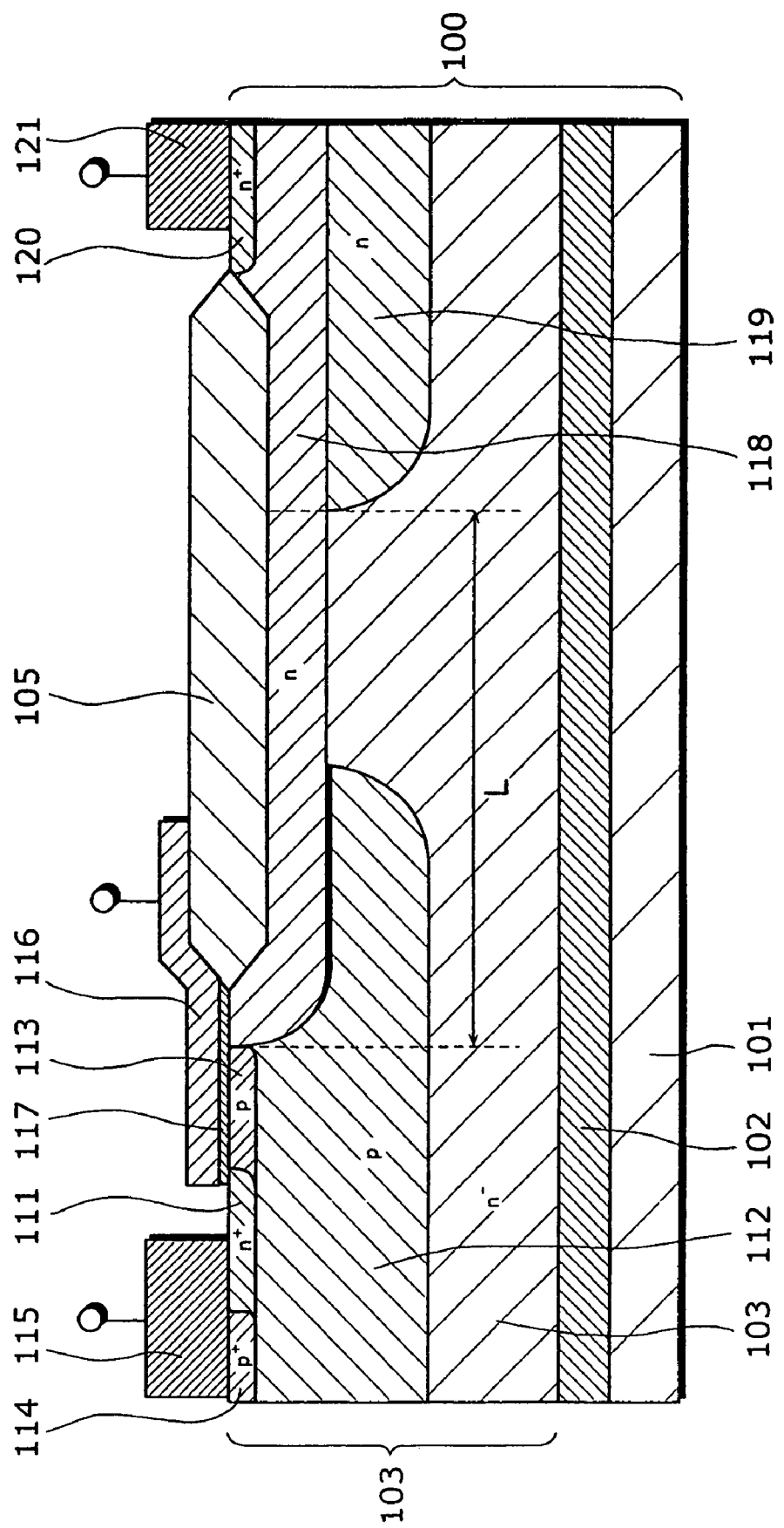
FIG. 1 is a cross-sectional view showing a structure of a MOS transistor described in Japanese Patent Laid-Open Application No. 2001-102586 publication.
Figure 2:
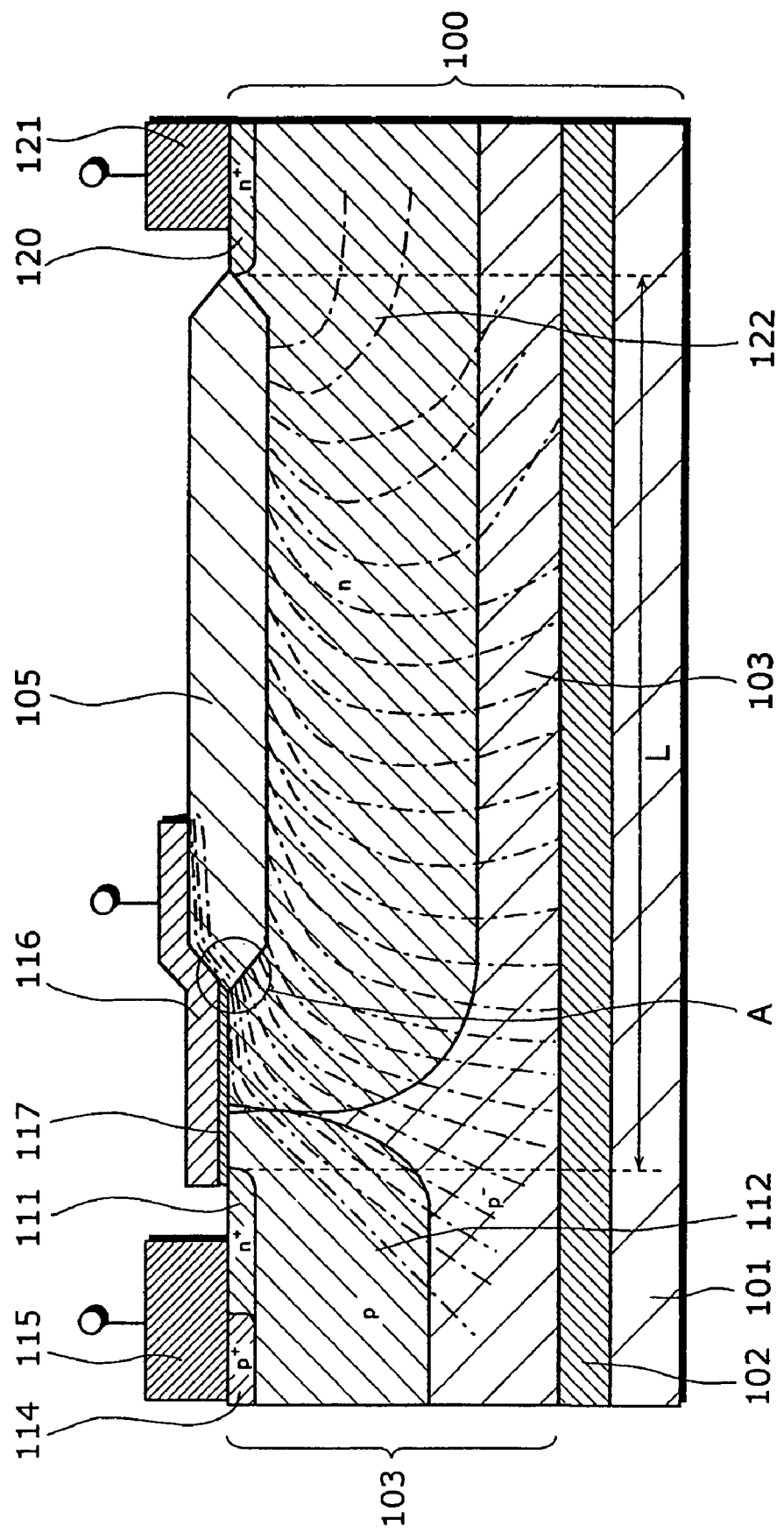
FIG. 2 is a cross-sectional view showing a structure and a potential distribution of a variation of the MOS transistor described in Japanese Patent Laid-Open Application No. 2001-102586 publication.

As shown in FIG. 7, it is seen that, in a region immediately under the gate oxide film 17, potentials in a direction parallel to a surface of the PN junction between the P type body region 12 and the N type drain buffer region 18 are increased, and spaces between the potentials in a region including the source side end of the LOCOS film 5a (A in FIG. 7) are great, as compared to those in the conventional MOS transistor in FIG. 2. That is, it is seen that a potential concentration in the region including the source side end of the LOCOS film 5a (A in FIG. 7) is reduced.

As described above, the MOS transistor according to the first embodiment has a structure in which the N type drain buffer region 18 that is in contact with the source side end of the LOCOS film 5a and shallower than the N type drain offset region 19 is formed between the P type body region 12 and the N type drain offset region 19. Accordingly, it is possible to reduce the potential concentration in the region including the source side end of the LOCOS film 5a (A in FIG. 7) when the gate electrode and the source electrode are set to 0 V and a positive voltage is applied to the drain electrode, so that the MOS transistor of the first embodiment can be realized as a MOS transistor that increases a drain-to-source breakdown voltage. Moreover, according to the MOS transistor of the first embodiment, the N type drain offset region 19 is deeper than the N type drain buffer region 18. Accordingly, the MOS transistor of the first embodiment can be realized as a MOS transistor that reduces an on-resistance. That is, it is possible to realize a MOS transistor that increases the drain-to-source breakdown voltage simultaneously maintaining the low on-resistance. For example, in a MOS transistor having the drain-to-source breakdown voltage of about 200 V, by adding the drain buffer region therein, the drain-to-source breakdown voltages is increased about 25 V more than that of the conventional MOS transistor in FIG. 2.

Further, according to the MOS transistor of the first embodiment, the N type drain buffer region 18 is in contact with the source end of the LOCOS film 5a and has an impurity concentration that is lower than that in the N type drain offset region 19. Accordingly, it is possible to reduce the impurity concentration in the region where electric field is increased, so that the MOS transistor of the first embodiment can be realized as a MOS transistor that significantly increases the drain-to-source breakdown voltage.

Furthermore, according to the MOS transistor of the first embodiment, the N type drain buffer region 18 of the low impurity concentration is formed in a limited region. Accordingly, the N type drain buffer region 18, whose impurity concentration is lowered to improve breakdown voltage characteristics, is positioned within the limited region, so that the MOS transistor of the first embodiment can be realized as a MOS transistor device that minimizes an increase of the on-resistance accompanied with improvement of breakdown voltage characteristics.

Still further, according to the MOS transistor of the first embodiment, the drain-to-source breakdown voltage and the on-resistance are varied according to the impurity concentration in the N type drain buffer region 18. Accordingly, by varying the impurity concentration in the N type drain buffer region 18, it is possible to freely vary the drain-to-source breakdown voltage and the on-resistance, so that the MOS transistor of the first embodiment can be realized as a MOS transistor that has high design flexibility.

Second Embodiment

Figure 8:
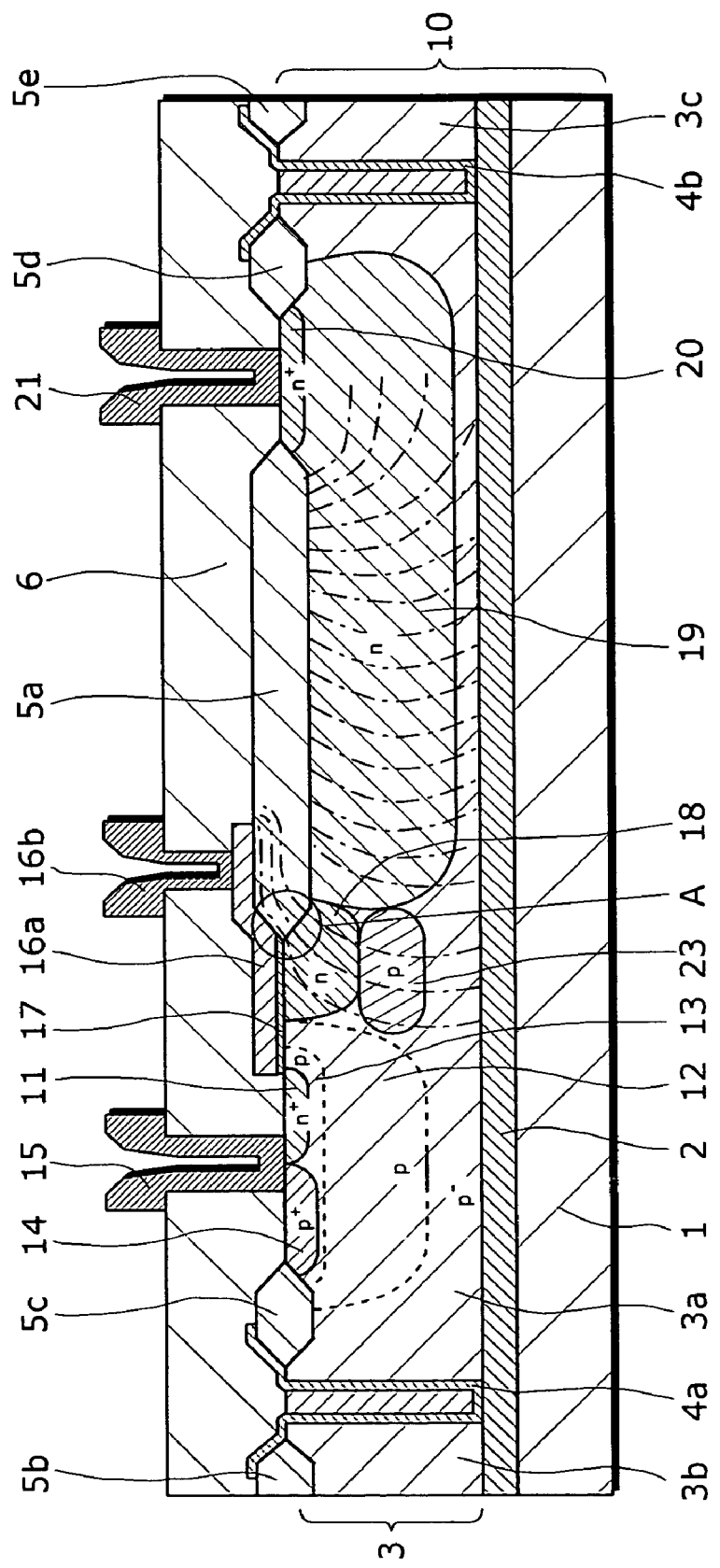
FIG. 8 is a cross-sectional view showing a structure and a potential distribution in a MOS transistor according to a second embodiment of the present invention.

FIG. 8 is a cross-sectional view showing a structure of an N channel MOS transistor according to a second embodiment of the present invention. Note that dashed lines in FIG. 8 show a potential distribution in the MOS transistor when a gate electrode and a source electrode are set to 0 V and a positive high voltage is applied to a drain electrode.

As shown in FIG. 8, the MOS transistor according to the second embodiment differs from the MOS transistor according to the first embodiment in that it has a P type impurity region 23 of a high concentration immediately under the N type drain buffer region 18.

Next, the following describes a method for manufacturing the MOS transistor having the above structure.

FIGS. 9A to 9D and 10A to 10D are cross-sectional sequential views showing processes in the method for manufacturing the MOS transistor.

Figure 9A:
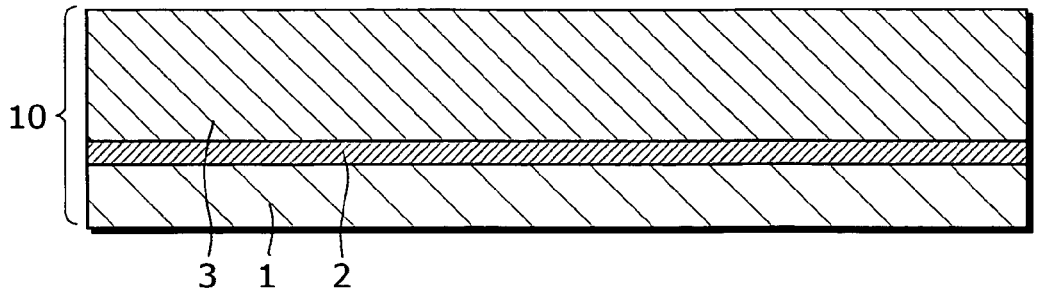
FIG. 9A is a cross-sectional view showing a manufacturing process for the MOS transistor according to the second embodiment of the present invention.
Figure 9B:
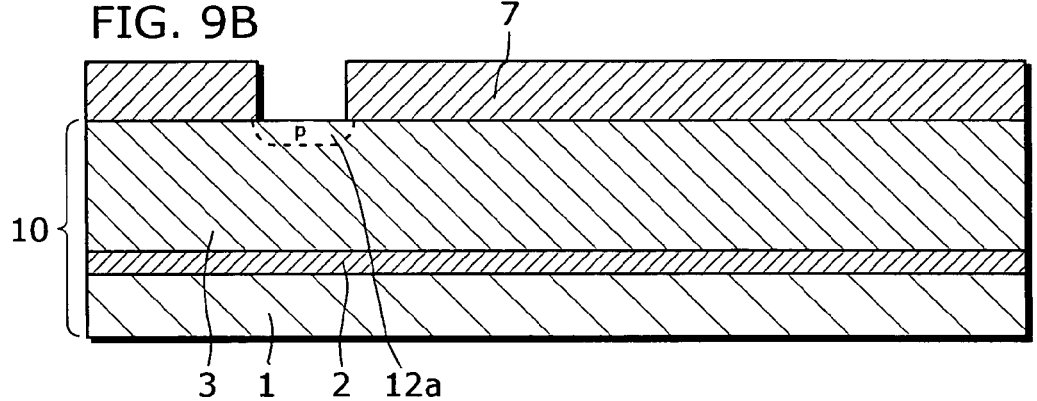
FIG. 9B is a cross-sectional view showing a manufacturing process for the MOS transistor according to the second embodiment of the present invention.

First, as shown in FIGS. 9A and 9B, a resist film 7 for forming the P type body region 12 is formed on the semiconductor layer 3 in the prepared SOI substrate 10, and using the resist film 7 as a mask, ion implantation is applied to form an impurity-implanted region 12a. Note that manufacturing processes shown in FIGS. 9A and 9B are the same as described above for the MOS transistor according to the first embodiment, so that the processes are not described herein.

Figure 9C:
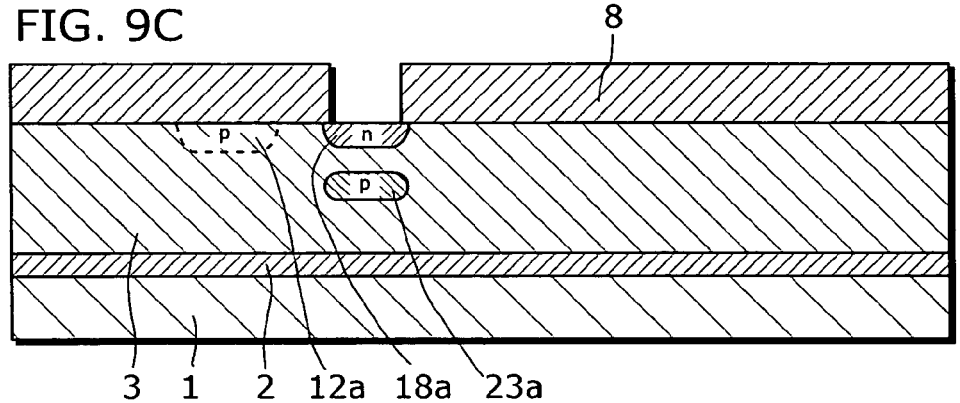
FIG. 9C is a cross-sectional view showing a manufacturing process for the MOS transistor according to the second embodiment of the present invention.
Figure 9D:
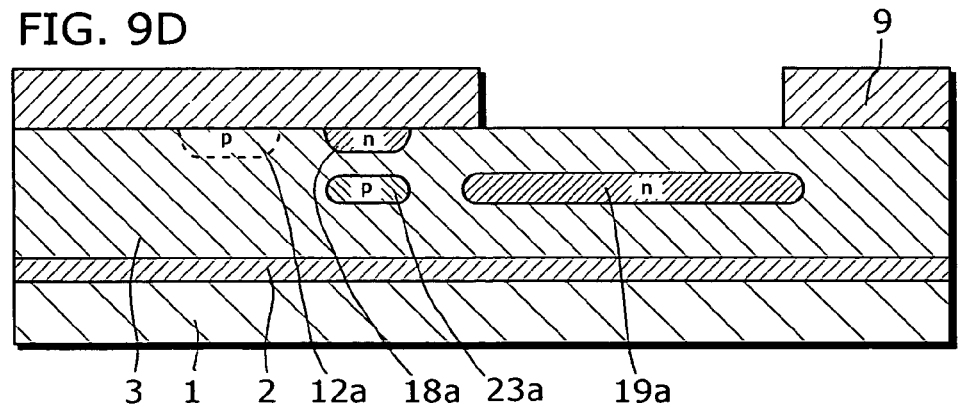
FIG. 9D is a cross-sectional view showing a manufacturing process for the MOS transistor according to the second embodiment of the present invention.
Figure 10A:
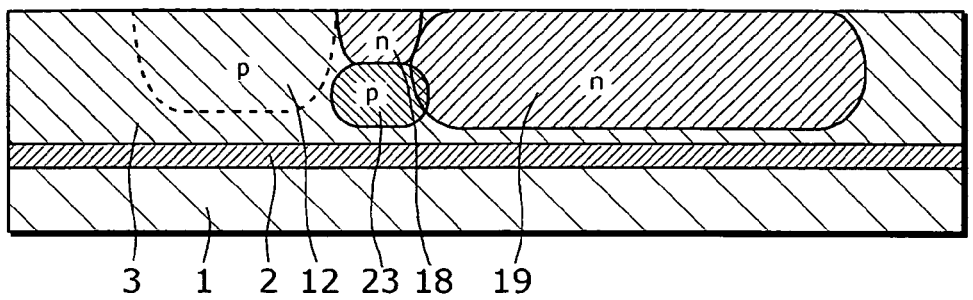
FIG. 10A is a cross-sectional view showing a manufacturing process for the MOS transistor according to the second embodiment of the present invention.
Figure 10B:
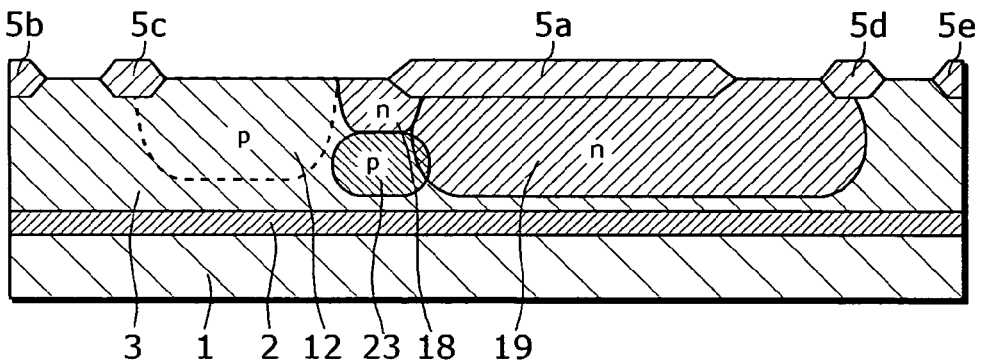
FIG. 10B is a cross-sectional view showing a manufacturing process for the MOS transistor according to the second embodiment of the present invention.
Figure 10C:
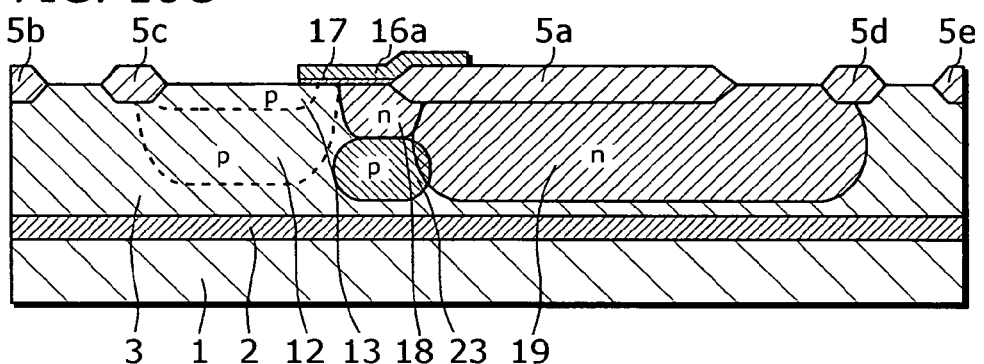
FIG. 10C is a cross-sectional view showing a manufacturing process for the MOS transistor according to the second embodiment of the present invention.
Figure 10D:
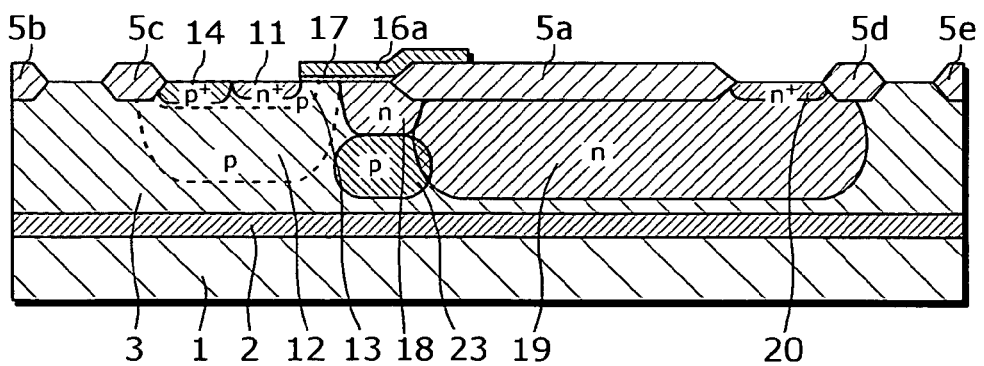
FIG. 10D is a cross-sectional view showing a manufacturing process for the MOS transistor according to the second embodiment of the present invention.

Next, as shown in FIG. 9C, after forming a resist film 8 having a thickness of about 2 μm to 4 μm on semiconductor layer 3, a resist pattern for forming the N type drain buffer region 18 and the P type impurity region 23 is formed. Then, using the resist film 8 as a mask, with a high accelerating voltage of 500 keV to 2.5 MeV and a dose amount of $5\times10^{11}$ $cm^{-2}$ to $1\times10^{13}$ $cm^{-2}$, boron ions as P type impurities are implanted into the semiconductor layer 3. Here, the implanted boron ions are positioned at a predetermined depth from a surface of the semiconductor layer 3 as the impurity-implanted region 23, and are not activated as a diffusion layer. Then, using the same resist film 8 as a mask, with an accelerating voltage of 50 keV to 500 keV and a dose amount of $5\times10^{11}$ $cm^{-2}$ to $1\times10^{13}$ $cm^{-2}$, phosphorus ions as N type impurities are implanted into the semiconductor layer 3 by ion implantation. Here, the implanted phosphorus ions are positioned near the surface of the semiconductor layer 3 as an impurity-implanted region 18a, and are not activated as a diffusion layer. After this ion implantation has been completed, the resist film 8 used as the mask is removed by an etching process.

Next, as shown in FIG. 9D and FIGS. 10A to 10D, a resist film 9 for forming the N type drain offset regions 19 is formed, and using the resist film 9 as a mask, ion implantation is applied to form an impurity-implanted region 19a. Then, by a thermal process, the impurity-implanted regions 12a, 18a, 19a and 23a are diffused to a predetermined diffusion depth, so that inactivated impurities become activated. With the above processes, the P type body region 12, the N type drain buffer region 18, the N type drain offset region 19, and the P type impurity region 23 are formed. After forming the LOCOS films 5a to 5e, sequentially formed are the gate oxide film 17, the gate electrode 16a, the P type Vt control diffusion region 13, the $N^+$ type source region 11, the $N^+$ type drain contact region 20, and the $P^+$ type back gate contact region 14. Note that manufacturing processes shown in FIGS. 9D and 10A to 10D are the same as described above for the MOS transistor according to the first embodiment, so that the processes are not described herein.

Here, by adjusting conditions of the ion implantation and the thermal process for forming the P type impurity region 23, the P type impurity region 23 has an impurity concentration peak in a part about 2 μm from the surface of the semiconductor layer 3 in order to set an impurity concentration peak of about $4 \times 10^{15}$ cm$^{-3}$. That is, the impurity concentration peak of the P type impurity region 23 is set to be higher than about $2 \times 10^{15}$ cm$^{-3}$ which is an impurity concentration peak of the P$^-$ type active region 3a.

Subsequent processes after the above are not illustrated, but after forming an interlayer insulation film 6 on the semiconductor layer 3 and contact holes in the interlayer insulation film 6, by depositing a metal film made of copper, aluminum, or the like by a vapor deposition process, and sequentially by patterning the metal film, there are formed the source electrode 15, the gate lead-out electrode 16b and the drain electrode 21.

Through the processes described above, the MOS transistor having the structure shown in FIG. 8 is obtained.

As described above, according to the MOS transistor of the second embodiment, the P type impurity region 23 is formed immediately under the N type drain buffer region 18. Therefore, a depletion layer extending from a PN junction part between the P type body region 12 and the N type drain offset region 19 becomes more difficult to extend towards the P type body region 12 than the depletion layer in the MOS transistor of the first embodiment, so that, in a region immediately under the gate oxide film 17, potentials in a direction parallel to a surface of the PN junction between the P type body region 12 and the N type drain buffer region 18 are increased. As a result, a potential concentration in a region including a source side end of the LOCOS film 5a (A in FIG. 8) is reduced, so that the MOS transistor of the second embodiment can be realized as a MOS transistor that increases a drain-to-source breakdown voltage more than that of the MOS transistor of the first embodiment.

Further, according to the MOS transistor of the second embodiment, due to an effect of the increase of the drain-to-source breakdown voltage by the P type impurity region 23, an impurity concentration in the N type drain buffer region 18 is increased to thereby reduce the on-resistance. That is, it is possible to reduce the on-resistance at a sacrifice of the drain-to-source breakdown voltage. Accordingly, the MOS transistor of the second embodiment can be realized as a MOS transistor that has an on-resistance lower than that of the MOS transistor of the first embodiment.

Figure 11:
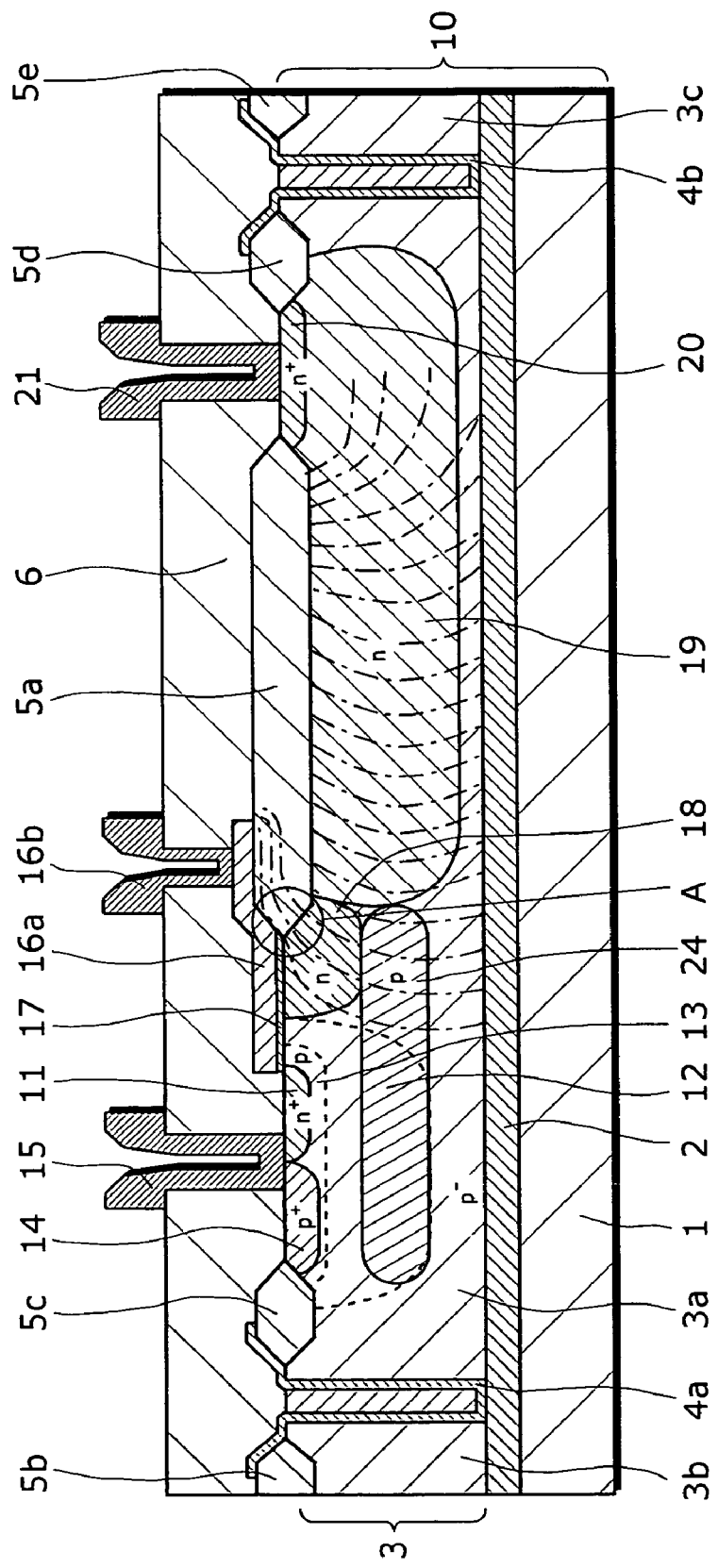
FIG. 11 is a cross-sectional view showing a structure and a potential distribution in a variation of the MOS transistor according to the second embodiment of the present invention.

Note that the MOS transistor of the second embodiment may have a structure as shown in a cross-sectional view of FIG. 11. Note that dashed lines in FIG. 11 show a potential distribution in the MOS transistor when a gate electrode and a source electrode are set to 0 V and a positive high voltage is applied to a drain electrode.

The MOS transistor shown in FIG. 11 differs from the MOS transistor of the second embodiment in that an end of a P type impurity region 24 immediately under the N type drain buffer region 18 is extended towards a source side, and a part of the P type impurity region 24 is overlapped with the P type body region 12. With the above structure, in the MOS transistor in FIG. 11, when the gate electrode and the source electrode are set to 0 V and a positive high voltage is applied to the drain electrode, a depletion layer extending from a PN junction part between the P type body region 12 and the N type drain offset region 19 becomes further difficult to extend towards a side of the P type body region 12 than the depletion layer in the MOS transistor in FIG. 8. As a result, potentials in a region including a source side end of the LOCOS film 5a (A in FIG. 11) are significantly reduced, so that it is possible to further increase the drain-to-source breakdown voltage.

Although only some exemplary embodiments of the MOS transistor according to the present invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A semiconductor device that is a MOS transistor, said semiconductor device comprising:
    a semiconductor substrate;
    a semiconductor layer of a first conductivity type formed above said semiconductor substrate; and
    a gate electrode formed above said semiconductor layer such that a gate insulating film is placed between said gate electrode and said semiconductor layer, wherein said semiconductor layer has:
        a body region of the first conductivity type;
        a source region of a second conductivity type formed in said body region to be exposed at a surface of said semiconductor layer;
        a drain offset region of the second conductivity type;
        a drain contact region of the second conductivity type formed in said drain offset region to be exposed at the surface of said semiconductor layer; and
        a drain buffer region of the second conductivity type formed between said drain offset region and said body region to adjoin said drain offset region and said body region,
    wherein said gate insulating film includes:
        a thin film part positioned at a side of said source region; and
        a thick film part positioned at a side of said drain contact region and having an end connected to said thin film part, and
    wherein said drain buffer region is in contact with said end of said thick film part and has a depth that is less than a depth of said drain offset region; and
    wherein said semiconductor layer further has an impurity region of the first conductivity type that is formed immediately under said drain buffer region.

2. The semiconductor device according to claim 1, wherein said impurity region has a section that is overlapped with said body region.

3. The semiconductor device according to claim 1, wherein the depth of said drain buffer region is in a range of one-third to one-half of the depth of said drain offset region.

4. The semiconductor device according to claim 1, wherein an impurity concentration of said drain buffer region is lower than an impurity concentration of said drain offset region.

5. The semiconductor device according to claim 1, further comprising an element isolation region, wherein said semiconductor layer is formed above said semiconductor substrate such that a buried insulating film is placed between said semiconductor layer and said semiconductor substrate.

6. The semiconductor device according to claim 1, wherein said thick film part of said gate insulating film is formed by a local-oxidation-of-silicon method.

7. A semiconductor device that is a MOS transistor, said semiconductor device comprising:
    a semiconductor substrate;
    a semiconductor layer of a first conductivity type formed above said semiconductor substrate; and
    a gate electrode formed above said semiconductor layer such that a gate insulating film is placed between said gate electrode and said semiconductor layer, wherein said semiconductor layer has:
  a body region of the first conductivity type;
  a source region of a second conductivity type formed in said body region to be exposed at a surface of said semiconductor layer;
  a drain offset region of the second conductivity type;
  a drain contact region of the second conductivity type formed in said drain offset region to be exposed at the surface of said semiconductor layer;
  a drain buffer region of the second conductivity type formed between said drain offset region and said body region to adjoin said drain offset region and said body region, and
  an impurity region of the first conductivity type formed immediately under said drain buffer region;
wherein said gate insulating film includes:
  a thin film part positioned at a side of said source region; and
  a thick film part positioned at a side of said drain contact region and having a tapered section with an end connected to said thin film part, and
wherein said drain buffer region is in contact with said end of said thick film part so as to cover a bottom of said tapered section, and has a depth that is less than a depth of said drain offset region; and
  wherein said drain offset region is in contact with a bottom of said thick film part so as to cover said bottom.

8. The semiconductor device according to claim 7, wherein said impurity region has a section that is overlapped with said body region.

9. The semiconductor device according to claim 7, wherein the depth of said drain buffer region is in a range of one-third to one-half of the depth of said drain offset region.

10. The semiconductor device according to claim 7, wherein an impurity concentration of said drain buffer region is lower than an impurity concentration of said drain offset region.

11. The semiconductor device according to claim 7, further comprising an element isolation region, wherein said semiconductor layer is formed above said semiconductor substrate such that a buried insulating film is placed between said semiconductor layer and said semiconductor substrate.

12. The semiconductor device according to claim 7, wherein said thick film part of said gate insulating film is formed by a local-oxidation-of-silicon method.

* * * * *